(12) United States Patent
Yokomichi

(10) Patent No.: US 10,944,002 B2
(45) Date of Patent: Mar. 9, 2021

(54) INTEGRATED ASSEMBLIES HAVING A PORTION OF A TRANSISTOR GATE EXTENDING INTO A RECESSED REGION OF A SEMICONDUCTOR BASE, AND METHODS OF FORMING INTEGRATED ASSEMBLIES

(71) Applicant: Micron Technology, Inc., Boise, ID (US)

(72) Inventor: Masahiro Yokomichi, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 96 days.

(21) Appl. No.: 16/124,734

(22) Filed: Sep. 7, 2018

(65) Prior Publication Data

US 2020/0083371 A1 Mar. 12, 2020

(51) Int. Cl.
*H01L 29/78* (2006.01)
*H01L 29/423* (2006.01)
*H01L 29/51* (2006.01)

(52) U.S. Cl.
CPC .... *H01L 29/7825* (2013.01); *H01L 29/42364* (2013.01); *H01L 29/512* (2013.01); *H01L 29/7834* (2013.01)

(58) Field of Classification Search
CPC ........... H01L 29/6656; H01L 29/66621; H01L 29/7825
See application file for complete search history.

(56) References Cited

U.S. PATENT DOCUMENTS

| 8,124,482 | B2 | 2/2012 | Denison et al. |
| 8,399,920 | B2 | 3/2013 | Juengling |
| 9,853,021 | B1* | 12/2017 | Wang .................. H01L 27/0617 |
| 2014/0147982 | A1* | 5/2014 | Ogata ............. H01L 21/823418 |
| | | | 438/303 |

* cited by examiner

*Primary Examiner* — Dale E Page
*Assistant Examiner* — Wilner Jean Baptiste
(74) *Attorney, Agent, or Firm* — Wells St. John P.S.

(57) ABSTRACT

Some embodiments include an integrated assembly with a semiconductor base having a horizontally-extending upper surface, and having a recessed region. A transistor gate is supported by the semiconductor base. The transistor gate has a first segment over the horizontally-extending upper surface, and has a second segment over the recessed region. The first segment has a first vertically-extending surface along an outer edge. The second segment has a ledge along an edge of the recessed region. The ledge has an upper surface which is lower than the horizontally-extending upper surface. The second segment has a second vertically-extending surface extending upwardly from an inner portion of the ledge. A first spacer is along the first vertically-extending surface. A second spacer is along the second vertically-extending surface. The second spacer has a bottom edge beneath the horizontally-extending upper surface of the base.

25 Claims, 8 Drawing Sheets

INTEGRATED ASSEMBLIES HAVING A PORTION OF A TRANSISTOR GATE EXTENDING INTO A RECESSED REGION OF A SEMICONDUCTOR BASE, AND METHODS OF FORMING INTEGRATED ASSEMBLIES

TECHNICAL FIELD

Integrated assemblies, and methods of forming integrated assemblies.

BACKGROUND

Transistors are commonly utilized in integrated circuitry. The transistors may be utilized as access devices in dynamic random-access memory (DRAM) or other memory; may be incorporated into sense amplifiers; may be utilized as driving transistors operated at high voltage; etc.

There is a continuing goal to increase integration density, with a corresponding goal to decrease the footprint of integrated components. It is therefore desired to develop transistor configurations which may be scalable into increasingly tighter footprints. A problem with conventional transistor configurations is that such transistor configurations are reaching the limits of scalability. For instance, as the channel regions of the conventional transistor configurations become increasingly shorter, the conventional transistor configurations suffer from so-called short-channel effects; which may include, for example, drain-induced barrier lowering, hot-carrier degradation, etc.

It would be desirable to develop improved transistor configurations suitable for incorporation into highly-integrated assemblies.

DETAILED DESCRIPTION OF THE ILLUSTRATED EMBODIMENTS

Some embodiments include integrated assemblies having one or more transistors which are configured to have a portion of their gate material extending into a recess in a semiconductor base. The recessed portion of the gate material has a ledge, and an insulative spacer may be supported by an upper surface of such ledge. A heavily-doped source/drain region may be outward of the recessed portion of the gate material. A lightly-doped diffusion region may be under the heavily-doped source/drain region, and may extend to under the recessed portion of the gate material. Example embodiments are described with reference to FIGS. 1-14.

Figure 1:
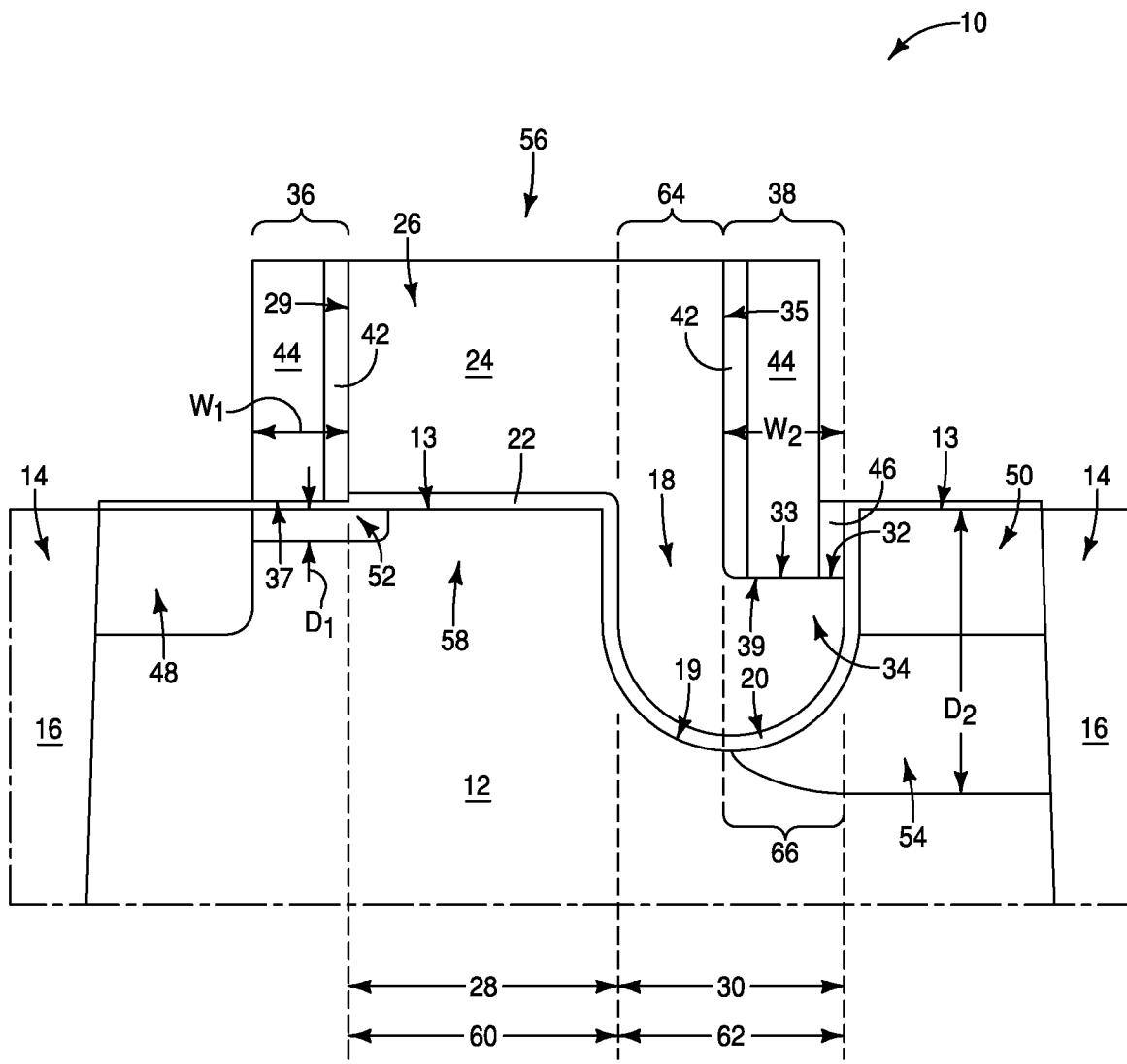
FIG. 1 is a diagrammatic cross-sectional side-view of a region of an example integrated assembly which includes an example transistor.

Referring to FIG. 1, a portion of an integrated assembly 10 is illustrated. The assembly includes a semiconductor base 12. The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

Isolation regions 14 extend into the base 12. The isolation regions 14 comprise insulative material 16. The insulative material 16 may comprise any suitable composition(s); and in some embodiments may comprise, consist essentially of, or consist of silicon dioxide. The isolation regions 14 may correspond to, for example, shallow trench isolation (STI).

The semiconductor base 12 has a horizontally-extending upper surface 13. In some embodiments, the surface 13 may be substantially planar; with the term "substantially planar" meaning planar to within reasonable tolerances of fabrication and measurement.

A recess 18 extends into the semiconductor base 12, and a recessed region 20 of the base 12 is within the recess 18. The recessed region 20 has an upper surface 19 which is lower than the horizontally-extending upper surface 13.

Gate dielectric material 22 extends along the horizontally-extending upper surface 13, and along the surface 19 of the recessed region 20. The gate dielectric material may comprise any suitable composition(s); and in some embodiments may comprise, consist essentially of, or consist of silicon dioxide.

Transistor gate material 24 is over the gate dielectric material 22, and may be considered to be supported by the base 12. The transistor gate material may comprise any suitable composition(s); and in some embodiments may comprise, consist essentially of, or consist of conductively-doped silicon. For instance, the transistor gate material 24 may comprise polycrystalline silicon doped to a concentration of at least about $10^{20}$ atoms/cm$^3$ with n-type dopant or p-type dopant.

The transistor gate material 24 may be considered to be configured as a transistor gate 26.

The transistor gate material 24 (or alternatively considered, the transistor gate 26) has a first segment 28 over the horizontally-extending upper surface 13, and has a second segment 30 extending into the recess 18; with the segments 28 and 30 being shown to extend along plane of the cross-section of FIG. 1. In some embodiments, the recess 18 may be referred to as an opening extending into the recessed region 20, and in such embodiments the second segment 30 of the transistor gate material 24 (or alternatively considered, the transistor gate 26) may be considered to extend into such opening.

The first segment 28 of the transistor gate material 24 (or alternatively considered, the transistor gate 26) has a vertically-extending surface 29 along an outer edge. The second segment 30 of the transistor gate material 24 (or alternatively considered, the transistor gate 26) has a ledge 32 along an edge of the recessed region 20 of the base 12, with such ledge having an upper surface 33 which is lower than the horizontally-extending upper surface 13 of the semiconductor base 12. The second segment 30 of the transistor gate material 24 (or alternatively considered, the transistor gate 26) also comprises a vertically-extending surface 35 extending upwardly from an inner portion of the ledge 32. In some embodiments, the vertically-extending surfaces 29 and 35 may be referred to as first and second vertically-extending surfaces, respectively.

The ledge 32 has an outer portion 34 which is outward of the vertically-extending surface 35.

In some embodiments, the surface 33 of the ledge 32 may be considered to be a horizontally-extending surface, or a substantially planar surface.

A first spacer 36 is along the first vertically-extending surface 29, and a second spacer 38 is along the second vertically-extending surface 35. In the illustrated embodiment, the first and second spacers 36 and 38 comprise a first material 42 along surfaces of the transistor gate material 24 and the base 12. The first and second spacers 36 and 38 also comprise a second material 44 outward of the first material 42. Additionally, the second spacer 38 comprises a third material 46 outward of the second material 44. In some embodiments, the first, second and third materials may be referred to as vertically-extending first, second and third materials in that they extend more along a vertical direction than along a horizontal direction.

The first, second and third materials 42, 44 and 46 may comprise any suitable compositions. In some embodiments, the first, second and third materials 42, 44 and 46 may be the same composition as one another; and, for example, may all comprise, consist essentially of, or consist of silicon nitride. In some embodiments the first and third materials 42 and 46 may be the same composition as one another (and may, for example, comprise, consist essentially of, or consist of silicon nitride), and the second material 44 may be different than the first and third materials (and may, for example, comprise silicon dioxide, silicon oxynitride, etc.). In such embodiments, the second spacer 38 may be considered to comprise a vertically-extending layer of the second material 44 sandwiched between two vertically-extending layers corresponding to the first and third materials 42 and 46; and the first spacer 36 may be considered to comprise vertically-extending layers of the first and second materials 42 and 44.

In the shown embodiment, the second spacer 38 is wider than the first spacer 36. Specifically, the first spacer 36 comprises a first lateral width $W_1$ and the second spacer 38 comprises a second lateral width $W_2$; with the second lateral width being greater than the first lateral width. In some embodiments, the second lateral width may be at least about 30% greater than the first lateral width, at least about 50% greater than the first lateral width, at least about double the first lateral width, etc.

The first spacer 36 has a bottom edge 37 over the horizontally-extending upper surface 13 of the base 12. The second spacer 38 has a bottom edge 39 on the outer portion 34 of the ledge 32; with such bottom edge 39 being beneath (i.e., lower than) the horizontally-extending upper surface 13 of the base 12. In some embodiments, the second spacer 38 may be considered to have a portion directly over a region of the ledge 32, with such portion having a bottom surface 39 which is lower than the horizontally-extending upper surface 13 of the base 12.

A first heavily-doped source/drain region 48 is outward of the first vertically-extending surface 29, and a second heavily-doped source/drain region 50 is outward of the second vertically-extending surface 35. The heavily-doped source/drain regions may be doped with any suitable dopant, and may be n-type doped regions of an NMOS (n-type metal oxide semiconductor) transistor or p-type doped regions of a PMOS (p-type metal oxide semiconductor) transistor. In some embodiments, the heavily-doped source/drain regions 48 and 50 may be doped to a concentration of at least about $10^{20}$ atoms/cm$^3$. In some embodiments, the region 48 may correspond to a source region and the region 50 may correspond to a drain region.

A first lightly-doped diffusion region 52 is inward of the first heavily-doped source/drain region 48; and in the shown embodiment the lightly-dopant diffusion region 52 extends to under the first vertically-extending surface 29.

A second lightly-doped diffusion region 54 is under the heavily-doped source/drain region 50; and in the shown embodiment the lightly-doped diffusion region 54 extends to under the recess 18 (i.e., extends to under a bottom of the recessed region 20 of the semiconductor base 12).

In the shown embodiment, the second lightly-doped diffusion region 54 is deeper than the first lightly-doped diffusion region 52. Specifically, the first lightly-doped diffusion region 52 extends to a first depth $D_1$ beneath the horizontally-extending surface 13, and the second lightly-doped diffusion region 54 extends to a second depth $D_2$ beneath the horizontally-extending surface 13; with the second depth being greater than the first depth. In some embodiments, the second depth may be at least about double the first depth, at least about triple the first depth, at least about 4 times greater than the first depth, at least about 10 times greater than the first depth, etc.

The lightly-doped diffusion regions 52 and 54 may comprise the same carrier type as the heavily-doped regions 48 and 50 (i.e., may be n-type regions within an NMOS transistor, or may be p-type regions within a PMOS transistor). The regions 52 and 54 are less heavily doped than the regions 48 and 50. In some embodiments, the regions 52 and 54 may be doped to a concentration of less than about $10^{16}$ atoms/cm$^3$; such as, for example, a concentration within a range of from about $10^{14}$ atoms/cm$^3$ to about $5 \times 10^{15}$ atoms/cm$^3$; a concentration within a range of from about $3 \times 10^{14}$ atoms/cm$^3$ to about $3 \times 10^{15}$ atoms/cm$^3$; etc. In some embodiments, the regions 48 and 52 may serve as a source region, and the regions 50 and 54 may serve as a drain region.

The transistor gate 26, together with the source/drain regions 48, 50, 52 and 54, forms a transistor 56. As discussed above, such transistor may be an NMOS transistor in some embodiments, or may be a PMOS transistor in other embodiments. The transistor has a channel region 58 under the gate material 24. The channel 58 extends between the source/drain regions 48/52 and the source/drain regions 50/54. In operation, the source/drain regions 48/52 are gatedly coupled with the source/drain regions 50/54 through application of voltage along the gate 26 (i.e., through an electric field induced by voltage along the gate 26). The recessed segment 30 of the gate 26 lengthens the channel region relative to a configuration lacking such recessed segment, and may thereby alleviate short-channel effects relative to conventional transistor configurations. Further, depletion may occur within the recessed segment 30 of the gate 26 which may alleviate hot-carrier degradation as compared to conventional configurations lacking the recessed segment 30. Such may be particularly advantageous in embodiments in which the recessed segment 30 is directly against the drain region of the transistor 56. In some embodiments, the transistor 56 of FIG. 1 may provide enhanced reliability, improved lifetime, improved scalability, etc., as compared to conventional transistor configurations.

The transistor 56 having the recessed segment 30 of the gate 26 may be particularly useful in applications in which the transistor is exposed to high voltage, and/or in applications in which the transistor is to be scaled into highly-integrated circuitry. In some embodiments, the transistor 56 may be incorporated into driving transistors associated with memory (e.g., DRAM), and/or may be incorporated into a sense amplifier.

In some embodiments, the transistor gate material 24 of FIG. 1 may be considered to comprise a first region 60 across a portion of the substantially planar upper surface 13 of the semiconductor base 12, and to comprise a second region 62 across the recessed region 20 of the semiconductor base 12. The second region 62 may be considered to have a post portion 64 and a ledge portion 66 adjacent to the post portion. The post portion 64 is along the first region 60, and the ledge portion 66 is spaced from the first region 60 by the post portion 64.

The ledge portion 66 has the upper surface 33 which is beneath the substantially planar upper surface 13 of the base 12.

The first sidewall surface 29 may be considered to be along the first region 60, and the second sidewall surface 35 may be considered to be along the post portion 64.

The transistor 56, and analogous transistors, may be formed with any suitable processing. Example processing is described with reference to FIGS. 2-14.

Figure 2:
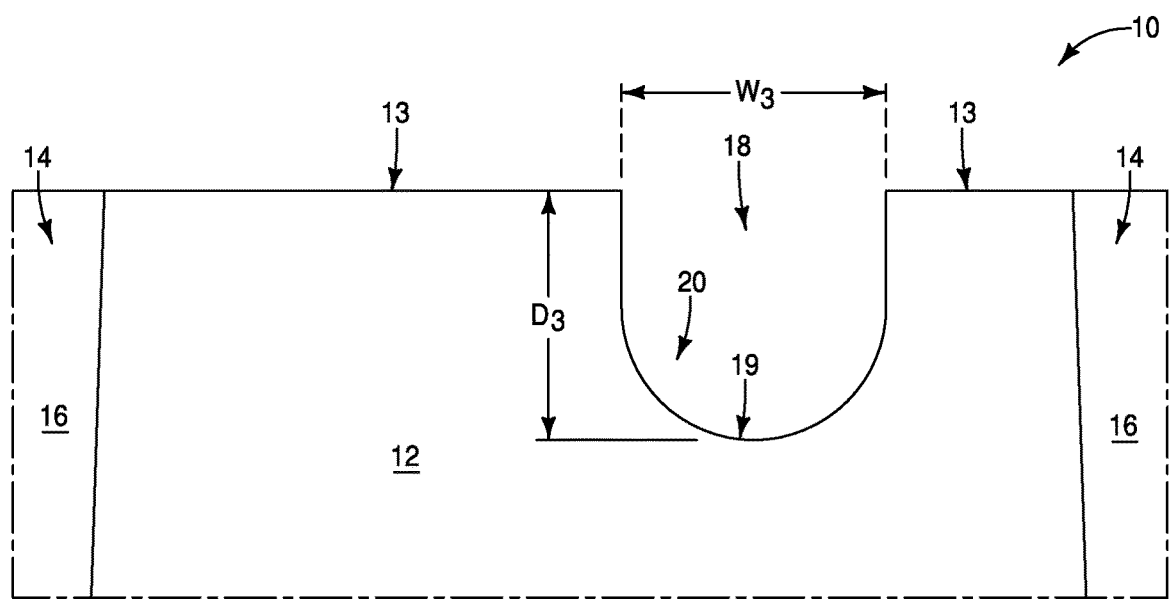
FIGS. 2-10 are diagrammatic cross-sectional side-views of a region of an example integrated assembly at example stages of an example method for forming an example transistor.

Referring to FIG. 2, the isolation regions 14 are formed to extend into the base 12, and the recess 18 is also formed to extend into the base 12. The recess 18 may be formed by providing a masking material (not shown) over the base to define a location of the recess, then etching into the base, and then removing the masking material to leave the configuration of FIG. 2. The base 12 of FIG. 2 comprises the horizontally-extending upper surface 13, and comprises the recessed region 20 having the upper surface 19. The horizontally-extending upper surface 13 may be substantially planar in some embodiments.

The recess 18 may be formed to any suitable dimensions, and is shown having a width $W_3$ and a depth $D_3$ along the cross-section of FIG. 2. In some embodiments, the width $W_3$ and the depth $D_3$ may be about the same as one another; and may, for example, both be about 60 nanometers (nm).

Figure 3:
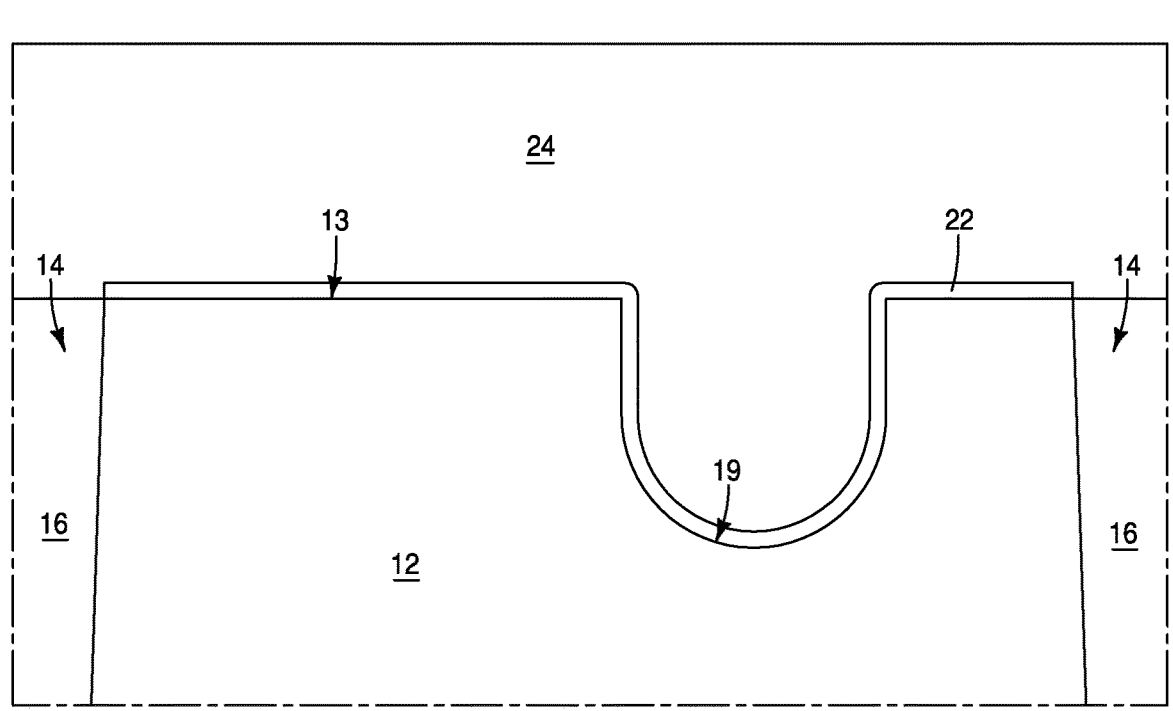

Referring to FIG. 3, the gate dielectric material 22 is formed along the upper surfaces 13 and 19 of the base 12. Such may be accomplished with any suitable processing. For instance, in some embodiments the material 22 may comprise silicon dioxide thermally grown from silicon of the base 12. In other embodiments, the material 22 may comprise insulative material which is deposited onto the upper surfaces 13 and 19 utilizing chemical vapor deposition (CVD), atomic layer deposition (ALD), or any other suitable process.

The gate material 24 is formed over the gate dielectric material 22. The material 24 may be formed with any suitable method; and in some embodiments may be deposited utilizing one or more of ALD, CVD, etc. The material 24 may be conductively doped with in situ processing during deposition of the material 24 and/or with an implant after the deposition of material 24.

Figure 4:
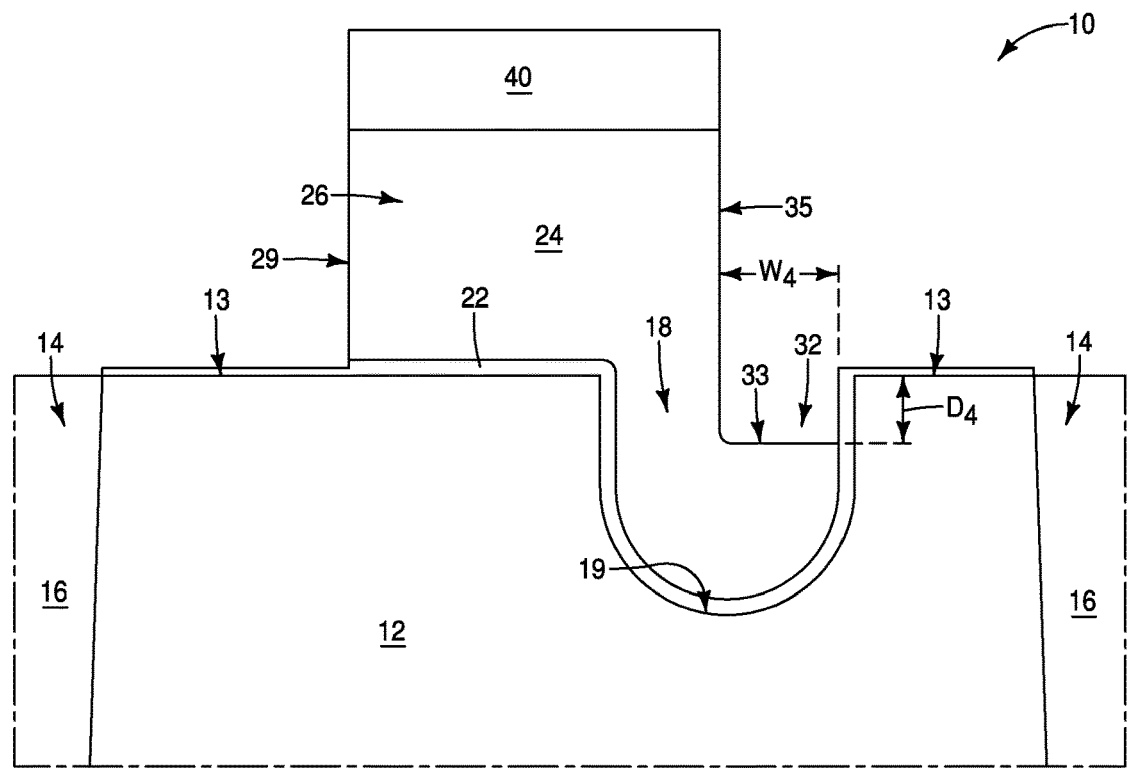

Referring to FIG. 4, the materials 22 and 24 are patterned into a configuration such that the material 24 is formed into the gate 26. The patterning of materials 22 and 24 may utilize one or more masking steps and one or more suitable etches. In the shown embodiment, a portion of patterned masking material 40 remains over the patterned gate material 24. The masking material 40 may comprise any suitable composition, such as, for example, photolithographically-patterned photoresist.

The patterned material 24 comprises the ledge 32 having the upper surface 33, with such upper surface 33 being lower than the horizontally-extending upper surface 13 of the base 12. The surface 33 of the ledge 32 may be lower than the horizontally-extending surface 13 by any suitable amount; and in some embodiments may be lower than the horizontally-extending surface 13 by at least about 50 angstroms (Å), at least about 100 Å, at least about 500 Å, etc. In the shown embodiment, the ledge 32 has a depth $D_4$ and a width $W_4$. In some embodiments, the width $W_4$ may be about half of the width $W_3$ of the recess 18 (with $W_3$ being shown in FIG. 3), and the depth $D_4$ may be about half of the depth $D_3$ of the recess 18 (with $D_3$ being shown in FIG. 3). In the shown embodiment, the width $W_4$ is about half of the width $W_3$, and the depth $D_4$ is less than half of the depth $D_3$ (and is about one-third of the depth $D_3$).

The illustrated mask of patterned masking material 40 may be utilized to form the gate 26, and then may remain in place during over-etching into the region of material 24 within the recess 18 to form the ledge 32.

In some embodiments, material 24 comprises polysilicon, material 22 comprises silicon dioxide, and material 24 is etched with high selectivity relative to material 22. The material 22 outward of the gate 26 is exposed to etching conditions and is thinned, but is not entirely removed.

The patterned material 24 comprises the first and second vertically-extending surfaces 29 and 35.

In some embodiments, the materials 24 and 22 may be considered to partially fill the portion of the recess 18 under the ledge 32, while leaving a remaining portion of the recess 18 unfilled over the ledge 32.

Figure 5:
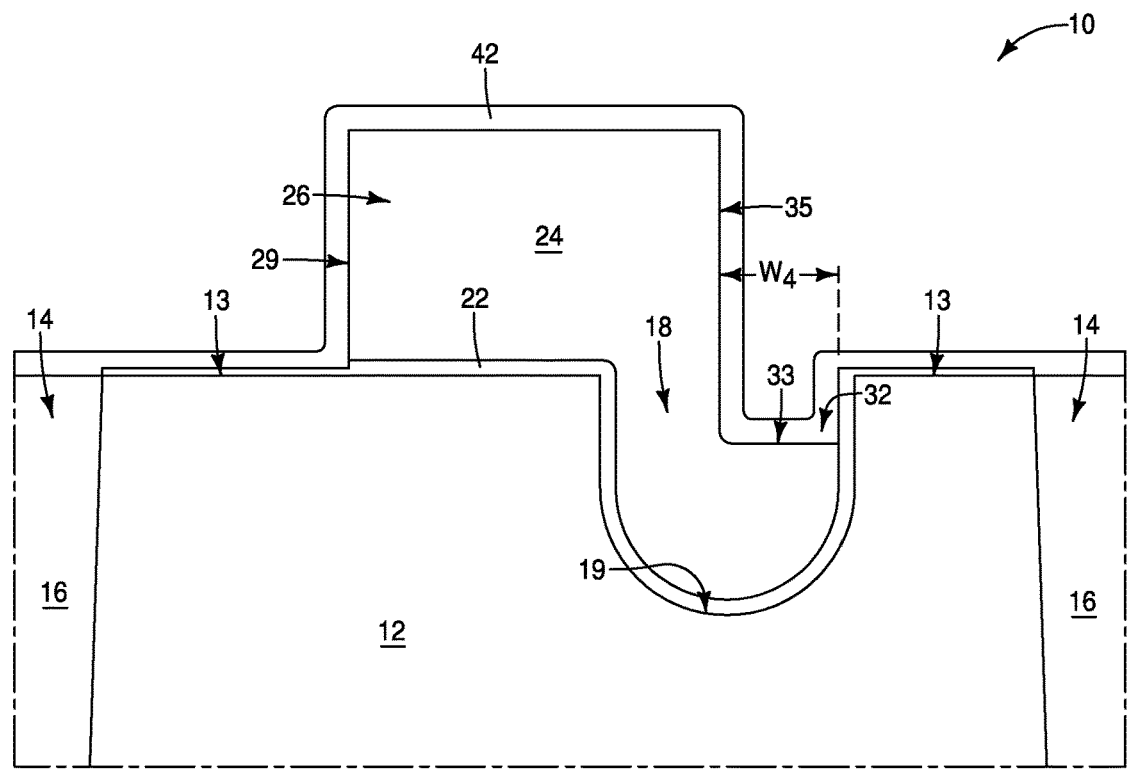

Referring to FIG. 5, masking material 40 (FIG. 4) is removed. Then, insulative material 42 is formed over the patterned material 24, along the sidewall surfaces 29 and 35, over the base 12, and over the isolation regions 14.

The insulative material 42 may, for example, comprise, consist essentially of, or consist of silicon nitride; and may be deposited with any suitable processing (e.g., ALD, CVD, etc.).

Figure 6:
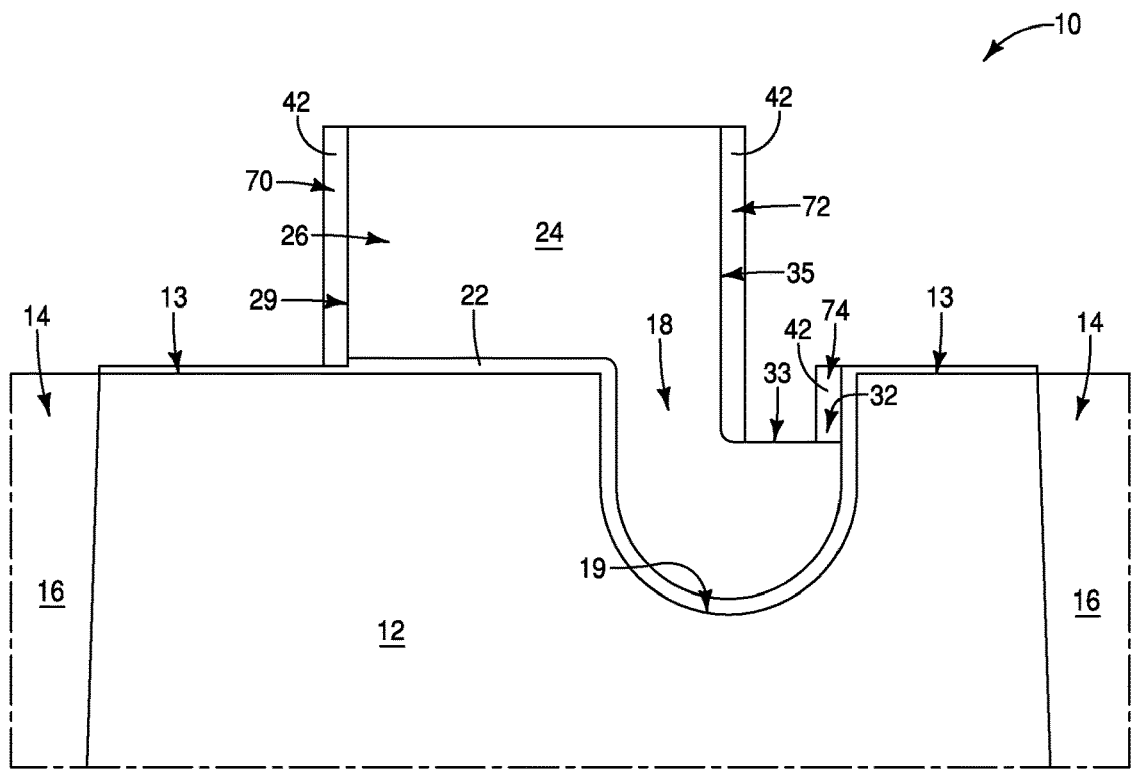

Referring to FIG. 6, the material 42 is patterned into spacer portions 70, 72 and 74. The material 42 may be patterned into the spacer portions 70, 72 and 74 with any suitable processing, including, for example, anisotropic etching.

Figure 7:
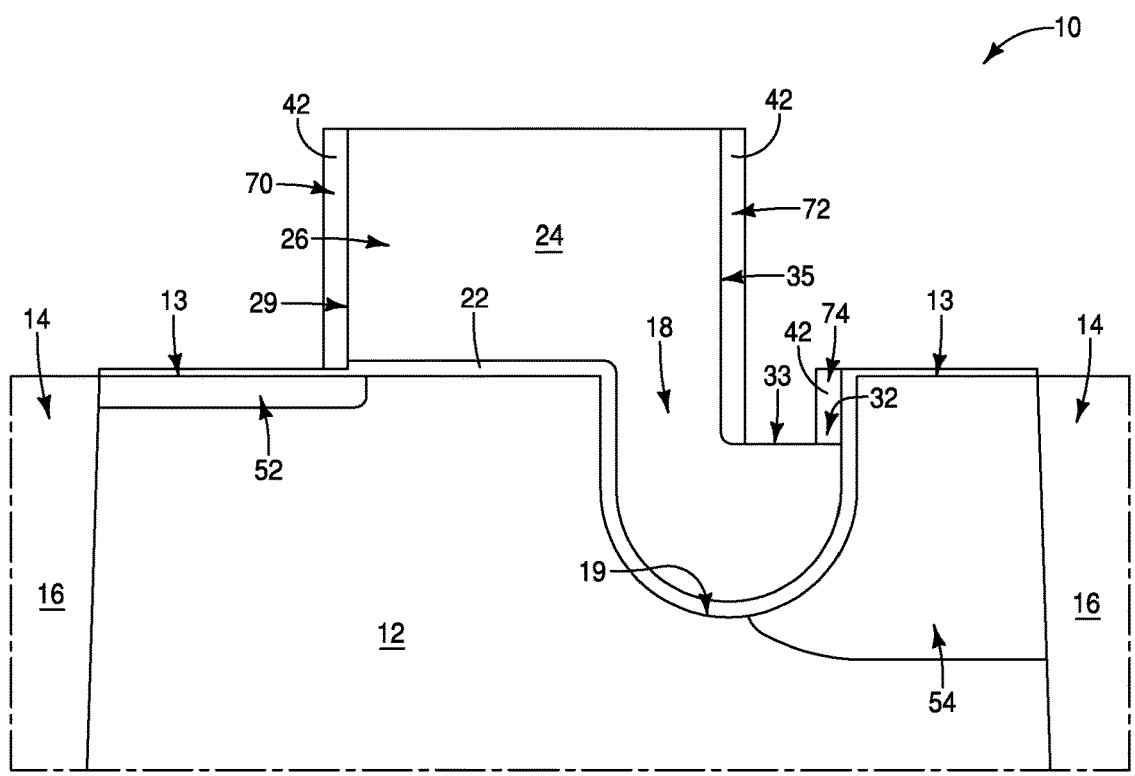

Referring to FIG. 7, dopant is implanted into the base 12 to form the lightly-doped diffusion regions 52 and 54.

Figure 8:
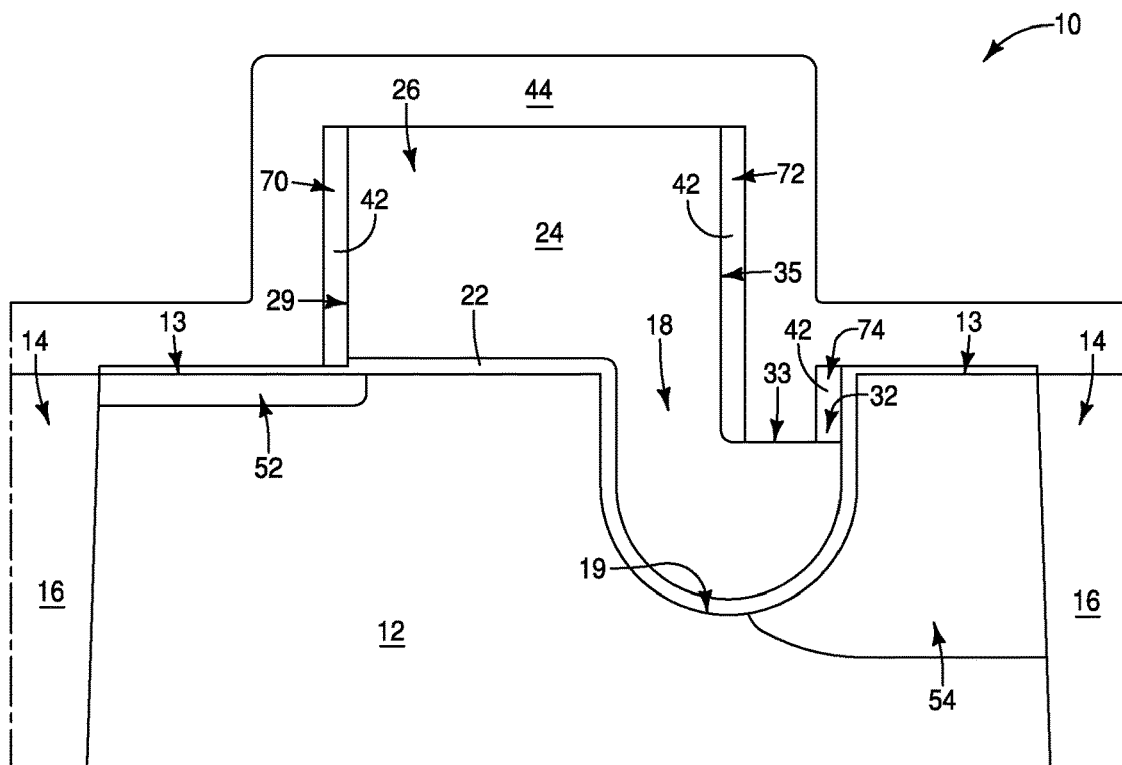

Referring to FIG. 8, insulative material 44 is formed over the patterned material 24, over the base 12 and over the isolation regions 14.

The insulative material 44 may, for example, comprise, consist essentially of, or consist of silicon nitride, and may be deposited with any suitable processing (e.g., ALD, CVD, etc.).

Figure 9:
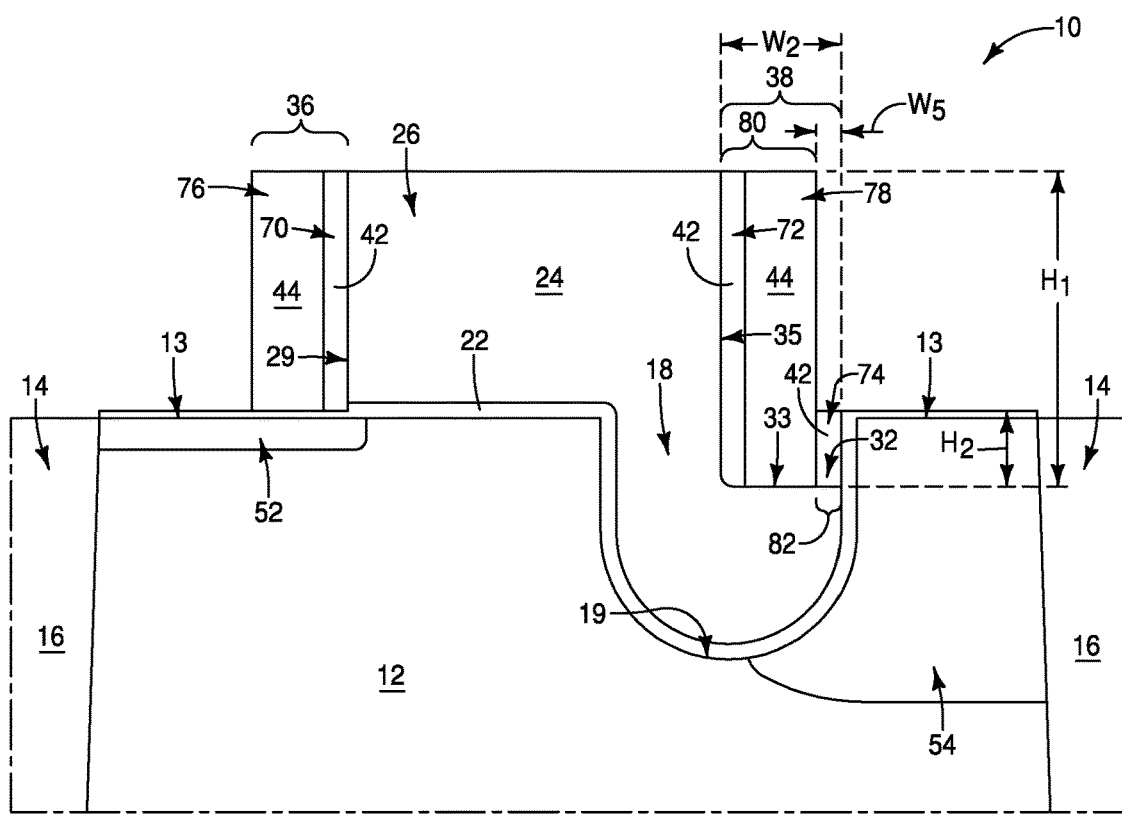

Referring to FIG. 9, the material 44 is patterned into spacer portions 76 and 78. The material 42 may be patterned into the spacer portions 76 and 78 with any suitable processing, including, for example, anisotropic etching. The spacer portions 70 and 76 together form the spacer 36; and the spacer portions 72, 74 and 78 together form the spacer 38. In the shown embodiment, the portions 72 and 74 of the spacer 38 are a same composition as one another (and comprise material 42). It is to be understood that in other embodiments, the portions 72 and 74 may be formed with other methods and may comprise different compositions relative to one another.

The spacer 38 has a first portion (or part) 80 having an upper surface at a first height $H_1$ over the surface 33 of the ledge 32, and has a second portion (or part) 82 having an upper surface at a second height $H_2$ over the surface 33 of the ledge 32. The first height $H_1$ is greater than the second $H_2$; and in some embodiments may be at least 2 times greater than the second height, at least 3 times greater than the second height, at least 4 times greater than the second height, at least 5 times greater than the second height, at least 10 times greater than the second height, etc. In the shown embodiment, the spacer 38 transitions from the first height $H_1$ to the second height $H_2$ at an interface between the portion 78 and the portion 74. In some embodiments, the portions 72, 78 and 74 may be referred to as first, second and third portions, respectively, which are laterally adjacent to one another. The embodiment of FIG. 9 may be considered to show the spacer 38 transitioning from the first height $H_1$ to the second height $H_2$ at the interface between the second portion 78 and the third portion 74.

The spacer 38 of FIG. 9 has the overall lateral width $W_2$. The portion of the spacer having the second height $H_2$ has a lateral width $W_5$. In some embodiments, $W_5$ may be less than or equal to about one-half of $W_2$, less than or equal to about one-third of $W_2$, less than or equal to about one-quarter of $W_2$, less than or equal to about one-fifth of $W_2$, etc. In some embodiments, the width $W_5$ may be within a range of from about one-fifth of $W_2$ to about one-half of $W_2$. The spacer 38 may be considered to fill a remaining portion of the recess 18 over the ledge 32.

Figure 10:
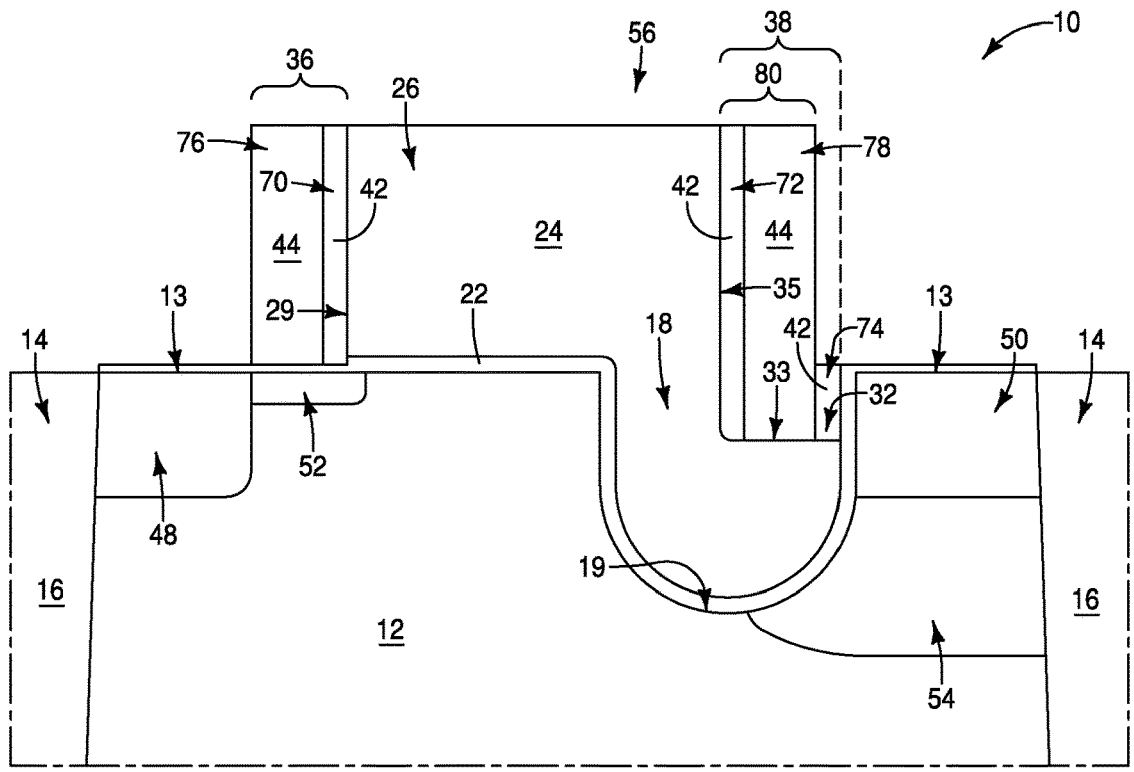

Referring to FIG. 10, the heavily-doped diffusion regions 48 and 50 are formed to extend into the base 12 alongside the spacers 36 and 38. In the shown embodiment, the gate dielectric material 22 is elongated between the insulative material 42 of spacer 38 and the heavily-doped diffusion region 50.

The configuration of FIG. 10 includes a transistor 56 analogous to the transistor described above with reference to FIG. 1.

Figure 11:
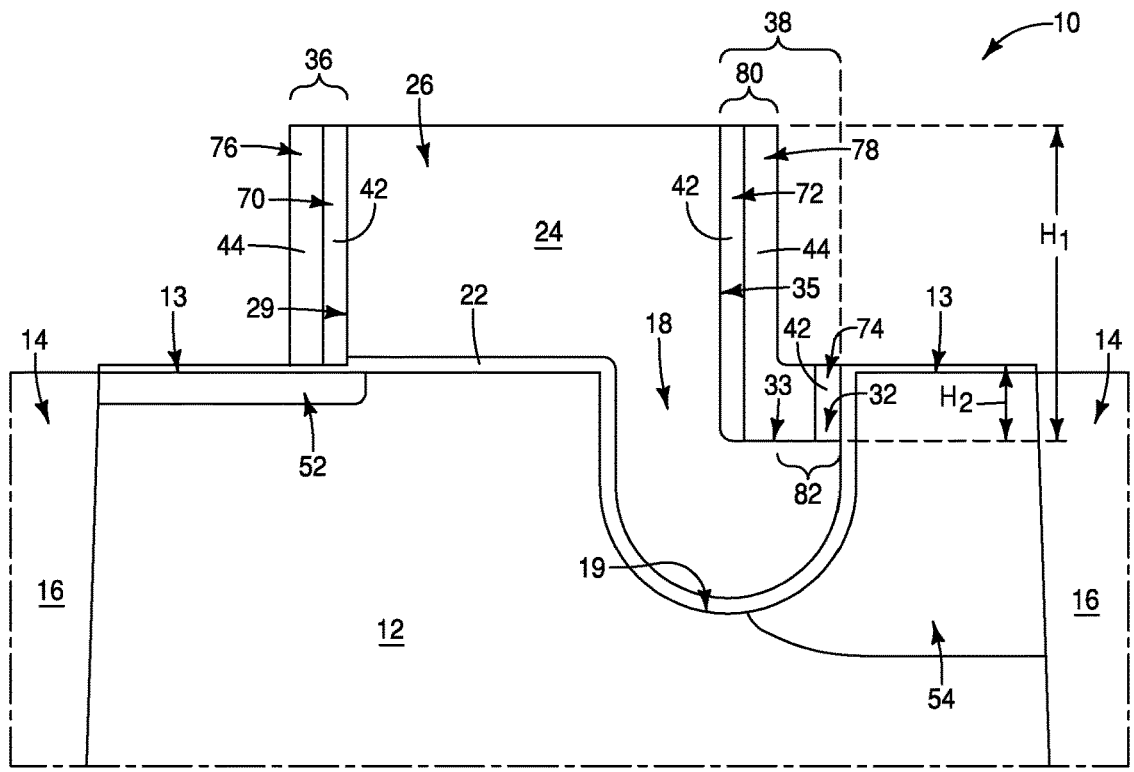
FIGS. 11 and 12 are diagrammatic cross-sectional side-views of a region of an example integrated assembly at example stages of an example method for forming an example transistor. The process stage of FIG. 11 may follow that of FIG. 7.
Figure 12:
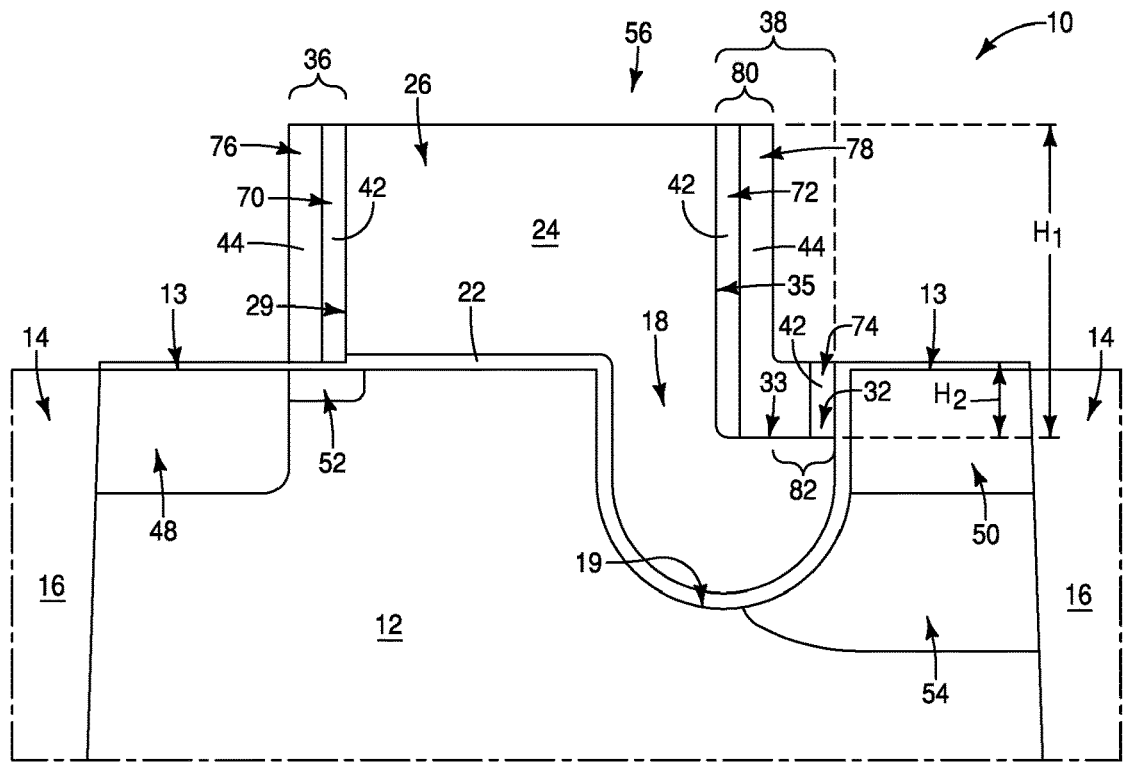

The processing of FIGS. 9 and 10 shows the material 44 etched into spacer portions 76 and 78 which are of suitable lateral width such that the portion 78 corresponds to about the lateral width remaining between the portions 72 and 74. In other embodiments, the material 44 may be etched to form thinner spacer portions, or thicker spacer portions. For instance, FIGS. 11 and 12 show a process analogous to that of FIGS. 9 and 10, but in which the material 44 is etched to form thinner spacer portions 76 and 78. In the embodiment of FIGS. 11 and 12, the spacer 38 transitions from the first height $H_1$ to the second height $H_2$ at a location within the second portion 78 (i.e., part of the second portion 78 is at the first height $H_1$, and part of the second portion 78 is at the second height $H_2$).

Figure 13:
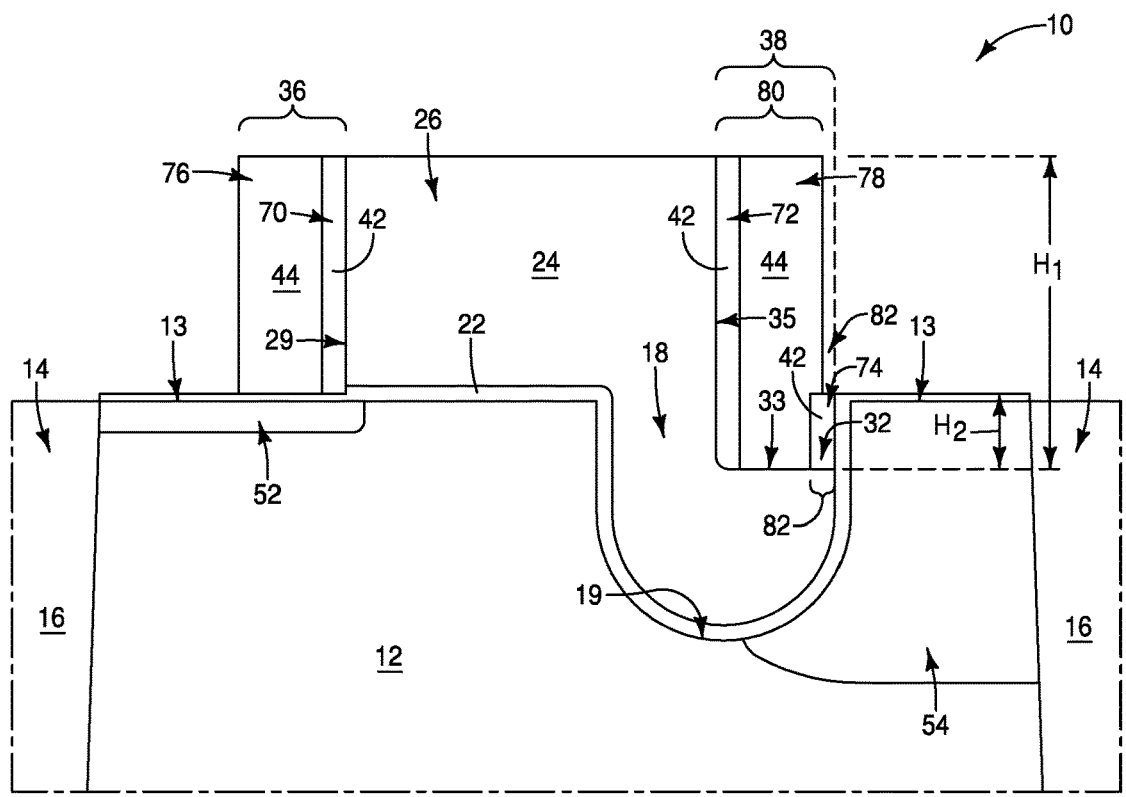
FIGS. 13 and 14 are diagrammatic cross-sectional side-views of a region of an example integrated assembly at example stages of an example method for forming an example transistor. The process stage of FIG. 13 may follow that of FIG. 7.
Figure 14:
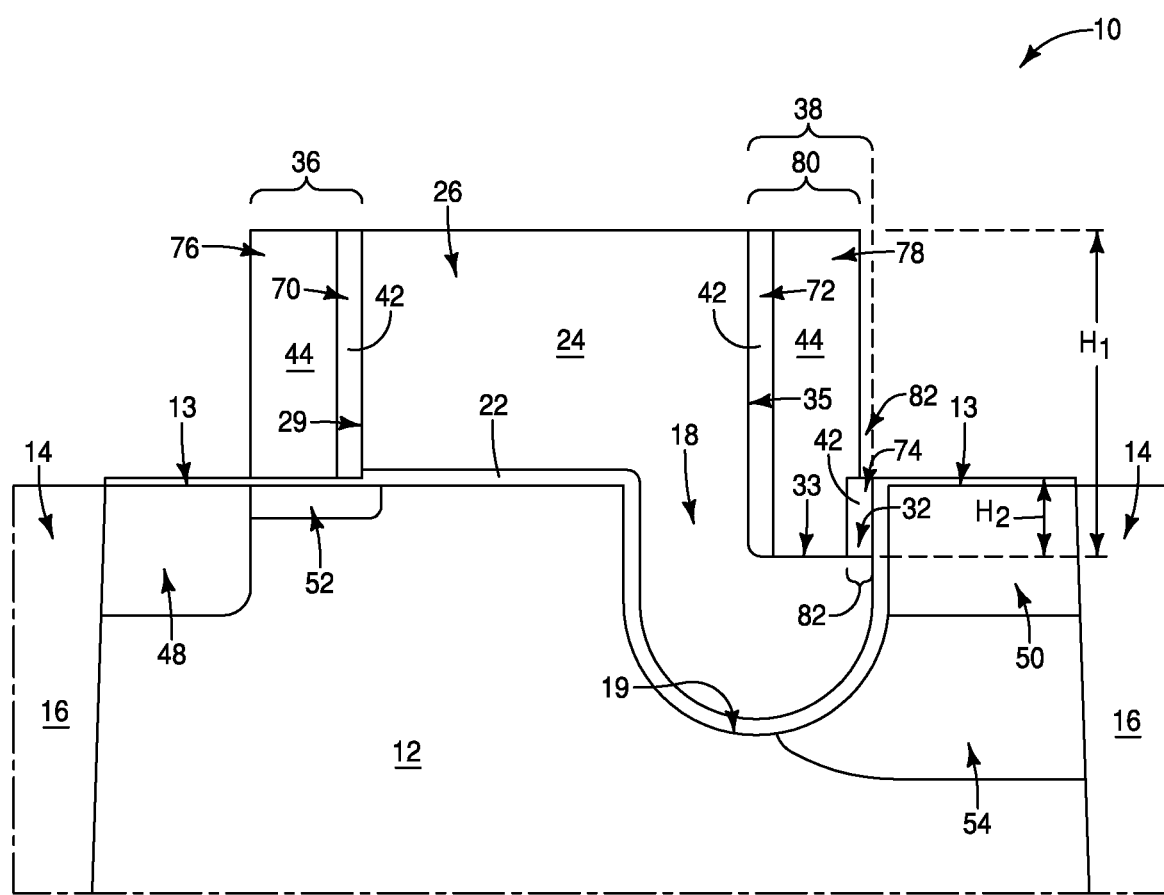

As another example, FIGS. 13 and 14 show a process analogous to that of FIGS. 9 and 10, but in which the material 44 is etched to form thicker spacer portions 76 and 78. In the embodiment of FIGS. 11 and 12, the spacer 38 transitions from the first height $H_1$ to the second height $H_2$ at a location over the third portion 74 (i.e., part of the third portion 74 is within the part of the spacer 38 at the first height $H_1$, and part of the third portion 74 is within the part of the spacer 38 the second height $H_2$).

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly. The integrated assembly includes a semiconductor base having a horizontally-extending upper surface, and having a recessed region with an upper surface beneath the horizontally-extending upper surface. An opening extends into the recessed region. A transistor gate is supported by the semiconductor base. The transistor gate, along a cross-section, has a first segment over the horizontally-extending upper surface, and has a second segment over the recessed region and extending into the opening. The first segment has a first vertically-extending surface along an outer edge. The second segment has a ledge along an edge of the recessed region. The ledge has an upper surface which is lower than the horizontally-extending upper surface of the semiconductor base. The second segment has a second vertically-extending surface extending upwardly from an inner portion of the ledge. An outer portion of the ledge is outward of the second vertically-extending surface. A first spacer is along the first vertically-extending surface. The first spacer has a bottom edge over the horizontally-extending upper surface of the base. A second spacer is along the second vertically-extending surface. The second spacer has a bottom edge beneath the horizontally-extending upper surface of the base and directly over the outer portion of the ledge.

Some embodiments include an integrated assembly comprising a semiconductor base having a substantially planar upper surface, and having a recessed region with an upper surface lower than the substantially planar upper surface. A transistor gate material is supported by the semiconductor base. The transistor gate material, along a cross-section, has a first region across a portion of the substantially planar upper surface, and has a second region across the recessed region. The second region has a post portion along the first region and extending into a recess of the recessed region. The second region has a ledge portion adjacent the post portion, with the ledge portion having an upper surface beneath the substantially planar upper surface of the base. The transistor gate material has a first sidewall surface along the first region and has a second sidewall surface along the post portion. A first heavily-doped source/drain region is outward of the first sidewall surface. A second heavily-doped source/drain region is outward of the second sidewall surface. A first lightly-doped diffusion region is inward of the first heavily-doped source/drain region and extends to under the first sidewall surface. A second lightly-doped diffusion region is under of the second heavily-doped source/drain region and extends to under a bottom of the recessed region of the semiconductor base.

Some embodiments include an integrated assembly comprising a semiconductor base. A recess is selectively formed in the semiconductor base so that the semiconductor base comprises a horizontally-extending upper surface and a recessed upper surface. Gate dielectric material is formed along the horizontally-extending upper surface and the recessed upper surface. Gate material is formed over the gate dielectric material. The gate material comprises a first segment over the horizontally-extending upper surface and a second segment over the recessed upper surface. The second segment comprising a post portion and a ledge portion. The post portion is between the first segment and the ledge portion and fills a portion of the recess in contact with the first segment. The ledge portion partially fills a remaining portion of the recess while keeping a part of the remaining portion of the recess unfilled. The integrated assembly further comprises insulative material filling the part of the remaining portion of the recess.

Some embodiments include a method of forming an integrated assembly. A semiconductor base is provided to have a horizontally-extending upper surface. A recess is formed to extend into the semiconductor base. Transistor gate material is formed over the horizontally-extending upper surface and within the recess. The transistor gate material is patterned into a transistor gate. The transistor gate, along a cross-section, has a first segment over the horizontally-extending upper surface, and has a second segment over the recess and extending into the recess. The first segment has a first vertically-extending surface along an outer edge. The second segment has a ledge along an edge of the recess. The ledge has an upper surface which is lower than the horizontally-extending upper surface of the semiconductor base. The second segment has a second vertically-extending surface extending upwardly from an inner portion of the ledge. An outer portion of the ledge is outward of the second vertically-extending surface. A first spacer is formed along the first vertically-extending surface. The first spacer has a bottom edge over the horizontally-extending upper surface of the base. A second spacer is formed along the second vertically-extending surface. The second spacer has a bottom edge beneath the horizontally-extending upper surface of the base and on the outer portion of the ledge. A first heavily-doped source/drain region is formed within the semiconductor base outward of the first vertically-extending surface. A second heavily-doped source/drain region is formed within the semiconductor base outward of the second vertically-extending surface.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:
1. An integrated assembly, comprising:
   a semiconductor base having a horizontally-extending upper surface, and having a recessed region with an upper surface beneath the horizontally-extending upper surface; an opening extending into the recessed region;
   a transistor gate supported by the semiconductor base; the transistor gate, along a cross-section, having a first segment over the horizontally-extending upper surface, and having a second segment over the recessed region and extending into the opening; the first segment having a first vertically-extending surface along an outer edge; the second segment having a ledge along an edge of the recessed region; the ledge having an upper surface which is lower than the horizontally-extending upper surface of the semiconductor base; the second segment having a second vertically-extending surface extending upwardly from an inner portion of the ledge; an outer portion of the ledge being outward of the second vertically-extending surface;
   a first spacer along the first vertically-extending surface; the first spacer having a bottom edge over the horizontally-extending upper surface of the base;
   a second spacer along the second vertically-extending surface, the second spacer having a bottom edge beneath the horizontally-extending upper surface of the base and directly over the outer portion of the ledge;
   wherein the second spacer is laterally wider than the first spacer; and
   wherein the second spacer comprises a vertically-extending second material sandwiched between vertically-extending first material and a vertically-extending third material.
2. The integrated assembly of claim 1 wherein the transistor gate comprises doped silicon.
3. The integrated assembly of claim 1 wherein:
   the first, second and third materials form first, second and third portions, respectively, of the second spacer;
   wherein the second spacer has a first part having an upper surface at a first height over the upper surface of the ledge, and has second part having an upper surface at a second height over the upper surface of the ledge, with the first height being at least double the second height; and wherein a transition from the first part of the second spacer to the second part of the second spacer is at an interface where the second portion joins the third portion.

4. The integrated assembly of claim 1 wherein:

the first, second and third materials form first, second and third portions, respectively, of the second spacer;

wherein the second spacer has a first part having an upper surface at a first height over the upper surface of the ledge, and has second part having an upper surface at a second height over the upper surface of the ledge, with the first height being at least double the second height; and wherein a transition from the first part of the second spacer to the second part of the second spacer is over the third portion.

5. The integrated assembly of claim 1 wherein:

the first, second and third materials form first, second and third portions, respectively, of the second spacer;

wherein the second spacer has a first part having an upper surface at a first height over the upper surface of the ledge, and has second part having an upper surface at a second height over the upper surface of the ledge, with the first height being at least double the second height; and wherein a transition from the first part of the second spacer to the second part of the second spacer is over the second portion.

6. The integrated assembly of claim 1 comprising:

a first heavily-doped source/drain region outward of the first vertically-extending surface;

a second heavily-doped source/drain region outward of the second vertically-extending surface;

a first lightly-doped diffusion region inward of the first heavily-doped source/drain region and extending to under the first vertically-extending surface; and a second lightly-doped diffusion region under the second heavily-doped source/drain region and extending to under a bottom of the recessed region.

7. The integrated assembly of claim 6 wherein:

the first lightly-doped diffusion region extends to a first depth beneath the horizontally-extending upper surface of the base;

the second lightly-doped diffusion region extends to a second depth beneath the horizontally-extending upper surface of the base; and the second depth is at least about double the first depth.

8. The integrated assembly of claim 6 wherein the first heavily-doped source/drain region, the second heavily-doped source/drain region, the first lightly-doped diffusion region and the second lightly-doped diffusion region are n-type regions.

9. The integrated assembly of claim 6 wherein the first heavily-doped source/drain region, the second heavily-doped source/drain region, the first lightly-doped diffusion region and the second lightly-doped diffusion region are p-type regions.

10. An integrated assembly, comprising:

a semiconductor base having a substantially planar upper surface, and having a recessed region with an upper surface lower than the substantially planar upper surface;

a transistor gate material supported by the semiconductor base; the transistor gate material, along a cross-section, having a first region across a portion of the substantially planar upper surface, and having a second region across the recessed region; the second region having a post portion along the first region and extending into a recess of the recessed region; the second region having a ledge portion adjacent the post portion, with the ledge portion having an upper surface beneath the substantially planar upper surface of the base; the transistor gate material having a first sidewall surface along the first region and having a second sidewall surface along the post portion;

a first heavily-doped source/drain region outward of the first sidewall surface;

a second heavily-doped source/drain region outward of the second sidewall surface;

a first lightly-doped diffusion region inward of the first heavily-doped source/drain region and extending to under the first sidewall surface;

a second lightly-doped diffusion region under of the second heavily-doped source/drain region and extending to under a bottom of the recessed region of the semiconductor base; and wherein:

the first lightly-doped diffusion region extends to a first depth beneath the substantially planar upper surface of the base;

the second lightly-doped diffusion region extends to a second depth beneath the substantially planar upper surface of the base; and the second depth is at least about double the first depth.

11. The integrated assembly of claim 10 wherein the upper surface of the ledge portion is substantially planar.

12. The integrated assembly of claim 10 wherein the transistor gate material comprises silicon.

13. The integrated assembly of claim 10 wherein the transistor gate material comprises polycrystalline silicon.

14. The integrated assembly of claim 10 wherein:

a first spacer is along the first sidewall surface, with the first spacer having a bottom edge over the substantially planar upper surface of the base; and a second spacer is along the second sidewall surface, with the second spacer having a bottom edge beneath the substantially planar upper surface of the base and on the ledge portion.

15. The integrated assembly of claim 14 wherein the second spacer is laterally wider than the first spacer.

16. The integrated assembly of claim 15 wherein the second spacer has a first part having an upper surface at a first height over the upper surface of the ledge portion, and has second part having an upper surface at a second height over the upper surface of the ledge portion, with the first height being at least 5 times greater than the second height.

17. The integrated assembly of claim 16 wherein the second spacer has a first lateral width, and there the second part of the second spacer has a second lateral width; the second lateral width being less than or equal to about one-half of the first lateral width.

18. The integrated assembly of claim 17 wherein the second lateral width is at least about one-fifth of the first lateral width.

19. The integrated assembly of claim 16 wherein:

the second spacer comprises first, second and third portions laterally adjacent to one another, with the second portion being laterally between the first and third portions; and wherein a transition from the first part of the second spacer to the second part of the second spacer is at an interface where the second portion joins to the third portion.

20. The integrated assembly of claim 16 wherein:
the second spacer comprises first, second and third portions laterally adjacent to one another, with the second portion being laterally between the first and third portions; and
wherein a transition from the first part of the second spacer to the second part of the second spacer is over the third portion.

21. The integrated assembly of claim 16 wherein:
the second spacer comprises first, second and third portions laterally adjacent to one another, with the second portion being laterally between the first and third portions; and
wherein a transition from the first part of the second spacer to the second part of the second spacer is over the second portion.

22. The integrated assembly of claim 10 wherein the first heavily-doped source/drain region, the second heavily-doped source/drain region, the first lightly-doped diffusion region and the second lightly-doped diffusion region are n-type regions.

23. The integrated assembly of claim 10 wherein the first heavily-doped source/drain region, the second heavily-doped source/drain region, the first lightly-doped diffusion region and the second lightly-doped diffusion region are p-type regions.

24. An integrated assembly, comprising:
a semiconductor base having a horizontally-extending upper surface, and having a recessed region with an upper surface beneath the horizontally-extending upper surface; an opening extending into the recessed region;
a transistor gate supported by the semiconductor base; the transistor gate, along a cross-section, having a first segment over the horizontally-extending upper surface, and having a second segment over the recessed region and extending into the opening; the first segment having a first vertically-extending surface along an outer edge; the second segment having a ledge along an edge of the recessed region; the ledge having an upper surface which is lower than the horizontally-extending upper surface of the semiconductor base; the second segment having a second vertically-extending surface extending upwardly from an inner portion of the ledge; an outer portion of the ledge being outward of the second vertically-extending surface;
a first spacer along the first vertically-extending surface; the first spacer having a bottom edge over the horizontally-extending upper surface of the base;
a second spacer along the second vertically-extending surface, the second spacer having a bottom edge beneath the horizontally-extending upper surface of the base and directly over the outer portion of the ledge;
a first heavily-doped source/drain region outward of the first vertically-extending surface;
a second heavily-doped source/drain region outward of the second vertically-extending surface;
a first lightly-doped diffusion region inward of the first heavily-doped source/drain region and extending to under the first vertically-extending surface;
a second lightly-doped diffusion region under the second heavily-doped source/drain region and extending to under a bottom of the recessed region;
wherein:
the first lightly-doped diffusion region extends to a first depth beneath the horizontally-extending upper surface of the base;
the second lightly-doped diffusion region extends to a second depth beneath the horizontally-extending upper surface of the base; and
the second depth is at least about double the first depth.

25. An integrated assembly, comprising:
a semiconductor base having a substantially planar upper surface, and having a recessed region with an upper surface lower than the substantially planar upper surface;
a transistor gate material supported by the semiconductor base; the transistor gate material, along a cross-section, having a first region across a portion of the substantially planar upper surface, and having a second region across the recessed region; the second region having a post portion along the first region and extending into a recess of the recessed region; the second region having a ledge portion adjacent the post portion, with the ledge portion having an upper surface beneath the substantially planar upper surface of the base; the transistor gate material having a first sidewall surface along the first region and having a second sidewall surface along the post portion;
a first heavily-doped source/drain region outward of the first sidewall surface;
a second heavily-doped source/drain region outward of the second sidewall surface;
a first lightly-doped diffusion region inward of the first heavily-doped source/drain region and extending to under the first sidewall surface;
a second lightly-doped diffusion region under of the second heavily-doped source/drain region and extending to under a bottom of the recessed region of the semiconductor base;
wherein:
a first spacer is along the first sidewall surface, with the first spacer having a bottom edge over the substantially planar upper surface of the base;
a second spacer is along the second sidewall surface, with the second spacer having a bottom edge beneath the substantially planar upper surface of the base and on the ledge portion;
wherein the second spacer is laterally wider than the first spacer; and
wherein the second spacer has a first part having an upper surface at a first height over the upper surface of the ledge portion, and has second part having an upper surface at a second height over the upper surface of the ledge portion, with the first height being at least 5 times greater than the second height.

* * * * *